(12) United States Patent
Pagaila et al.

(10) Patent No.: US 8,406,004 B2
(45) Date of Patent: Mar. 26, 2013

(54) INTEGRATED CIRCUIT PACKAGING SYSTEM AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 249 days.

(21) Appl. No.: 12/331,341

(22) Filed: Dec. 9, 2008

(65) Prior Publication Data
US 2010/0142174 A1   Jun. 10, 2010

(51) Int. Cl.
*H05K 7/00* (2006.01)

(52) U.S. Cl. ........ 361/760; 361/697; 257/608; 257/666; 257/667; 257/673; 257/676; 257/678; 257/686; 257/690; 257/737; 257/787; 257/796

(58) Field of Classification Search .................. 361/760, 361/697; 257/608, 666, 667, 673, 676, 678, 257/686, 690, 737, 777, 787, 796
See application file for complete search history.

(56) References Cited

U.S. PATENT DOCUMENTS

| | | | | |
|---|---|---|---|---|
| 5,387,814 | A * | 2/1995 | Baudouin et al. | 257/690 |
| 5,598,034 | A * | 1/1997 | Wakefield | 257/706 |
| 5,648,682 | A * | 7/1997 | Nakazawa et al. | 257/673 |
| 5,960,260 | A * | 9/1999 | Umehara et al. | 438/118 |
| 5,986,334 | A * | 11/1999 | Lee | 257/667 |
| 6,069,408 | A * | 5/2000 | Honda et al. | 257/787 |
| 6,080,264 | A * | 6/2000 | Ball | 156/292 |
| 6,159,770 | A * | 12/2000 | Tetaka et al. | 438/112 |
| 6,191,494 | B1 * | 2/2001 | Ooyama et al. | 257/796 |
| 6,245,598 | B1 | 6/2001 | Chen et al. | |
| 6,379,997 | B1 * | 4/2002 | Kawahara et al. | 438/106 |
| 6,406,934 | B1 * | 6/2002 | Glenn et al. | 438/106 |
| 6,638,792 | B2 | 10/2003 | Hui et al. | |
| 6,664,614 | B2 * | 12/2003 | Kim | 257/666 |
| 6,680,524 | B2 | 1/2004 | Minamio et al. | |
| 6,713,849 | B2 * | 3/2004 | Hasebe et al. | 257/667 |
| 6,818,973 | B1 * | 11/2004 | Foster | 257/676 |
| 6,882,048 | B2 * | 4/2005 | Ikenaga et al. | 257/736 |
| 6,998,344 | B2 | 2/2006 | Akram et al. | |
| 7,049,696 | B2 * | 5/2006 | Kubo | 257/706 |
| 7,115,441 | B2 * | 10/2006 | Choi | 438/109 |
| 7,170,149 | B2 * | 1/2007 | Shirasaka et al. | 257/666 |
| 7,245,007 | B1 * | 7/2007 | Foster | 257/678 |
| 7,253,503 | B1 * | 8/2007 | Fusaro et al. | 257/668 |
| 7,282,431 | B2 | 10/2007 | Kang et al. | |
| 7,348,663 | B1 * | 3/2008 | Kirloskar et al. | 257/704 |
| 7,488,621 | B2 * | 2/2009 | Epler et al. | 438/113 |
| 7,501,697 | B2 * | 3/2009 | Yim et al. | 257/686 |
| 7,517,733 | B2 * | 4/2009 | Camacho et al. | 438/123 |
| 7,635,910 | B2 * | 12/2009 | Sinaga et al. | 257/673 |
| 7,687,897 | B2 * | 3/2010 | Ha et al. | 257/686 |
| 7,714,453 | B2 * | 5/2010 | Khan et al. | 257/787 |

(Continued)

OTHER PUBLICATIONS

U.S. Appl. No. 12/331,347, filed Dec. 9, 2008, Pagaila et al.

*Primary Examiner* — Xiaoliang Chen
(74) *Attorney, Agent, or Firm* — Ishimaru & Associates LLP; John Yang

(57) ABSTRACT

A method of manufacture of an integrated circuit packaging system includes providing an integrated circuit having an active side and a non-active side; forming an indent, having a flange and an indent side, from a peripheral region of the active side; and forming a conformal interconnect, having an elevated segment, a slope segment, and a flange segment, over the indent.

4 Claims, 6 Drawing Sheets

U.S. PATENT DOCUMENTS

| | | |
|---|---|---|
| 7,952,176 B2 | 5/2011 | Pagaila et al. |
| 2001/0019852 A1* | 9/2001 | Hashimoto .................. 438/106 |
| 2003/0027375 A1* | 2/2003 | Hashimoto .................. 438/106 |
| 2003/0042589 A1* | 3/2003 | Hong ........................... 257/686 |
| 2006/0043518 A1* | 3/2006 | Nakaji et al. ................ 257/458 |
| 2006/0125077 A1* | 6/2006 | Akaike et al. ............... 257/690 |
| 2006/0145341 A1* | 7/2006 | Jiang et al. .................. 257/734 |
| 2006/0170081 A1* | 8/2006 | Gerber et al. ................ 257/666 |
| 2006/0256525 A1* | 11/2006 | Shim et al. .................. 361/697 |
| 2007/0164409 A1* | 7/2007 | Holland ....................... 257/678 |
| 2007/0170570 A1* | 7/2007 | Camacho et al. ............ 257/686 |
| 2007/0194424 A1* | 8/2007 | Camacho et al. ............ 257/686 |
| 2007/0269931 A1 | 11/2007 | Chung et al. |
| 2007/0278629 A1* | 12/2007 | Smith ........................... 257/666 |
| 2008/0145589 A1 | 6/2008 | Hung et al. |
| 2008/0182434 A1* | 7/2008 | Goida ............................ 439/68 |
| 2008/0290486 A1* | 11/2008 | Chen et al. ................... 257/676 |
| 2009/0001612 A1* | 1/2009 | Song et al. ................... 257/787 |
| 2009/0096097 A1* | 4/2009 | Kagaya et al. ................ 257/737 |
| 2009/0127715 A1* | 5/2009 | Shin et al. .................... 257/777 |
| 2009/0212404 A1* | 8/2009 | Sim et al. ..................... 257/667 |
| 2009/0321913 A1* | 12/2009 | Shim et al. ................... 257/690 |
| 2010/0006996 A1* | 1/2010 | Heres et al. .................. 257/676 |
| 2010/0084756 A1* | 4/2010 | Dirks et al. ................... 257/690 |

* cited by examiner

INTEGRATED CIRCUIT PACKAGING SYSTEM AND METHOD OF MANUFACTURE THEREOF

CROSS-REFERENCE TO RELATED APPLICATION

The present application contains subject matter related to concurrently filed U.S. patent application Ser. No. 12/331,347, now U.S. Pat. No. 7,952,176. The related application is assigned to STATS ChipPAC Ltd, and is incorporated herein by reference thereto.

TECHNICAL FIELD

The present invention relates generally to an integrated circuit packaging system, and more particularly to a system having an interconnect.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit having an active side and a non-active side; forming an indent, having a flange and an indent side, from a peripheral region of the active side; and forming a conformal interconnect, having an elevated segment, a slope segment, and a flange segment, over the indent.

The present invention provides an integrated circuit packaging system, including: an integrated circuit having an active side and a non-active side, with an indent, having a flange and an indent side, in a peripheral region of the active side; and a conformal interconnect having an elevated segment, a sloped segment and a flange segment, over the indent.

Certain embodiments of the invention have other steps or elements in addition to or in place of those mentioned or obvious from the above. The steps or elements will become apparent to those skilled in the art from a reading of the following detailed description when taken with reference to the accompanying drawings.

BEST MODE FOR CARRYING OUT THE INVENTION

Figure 1:
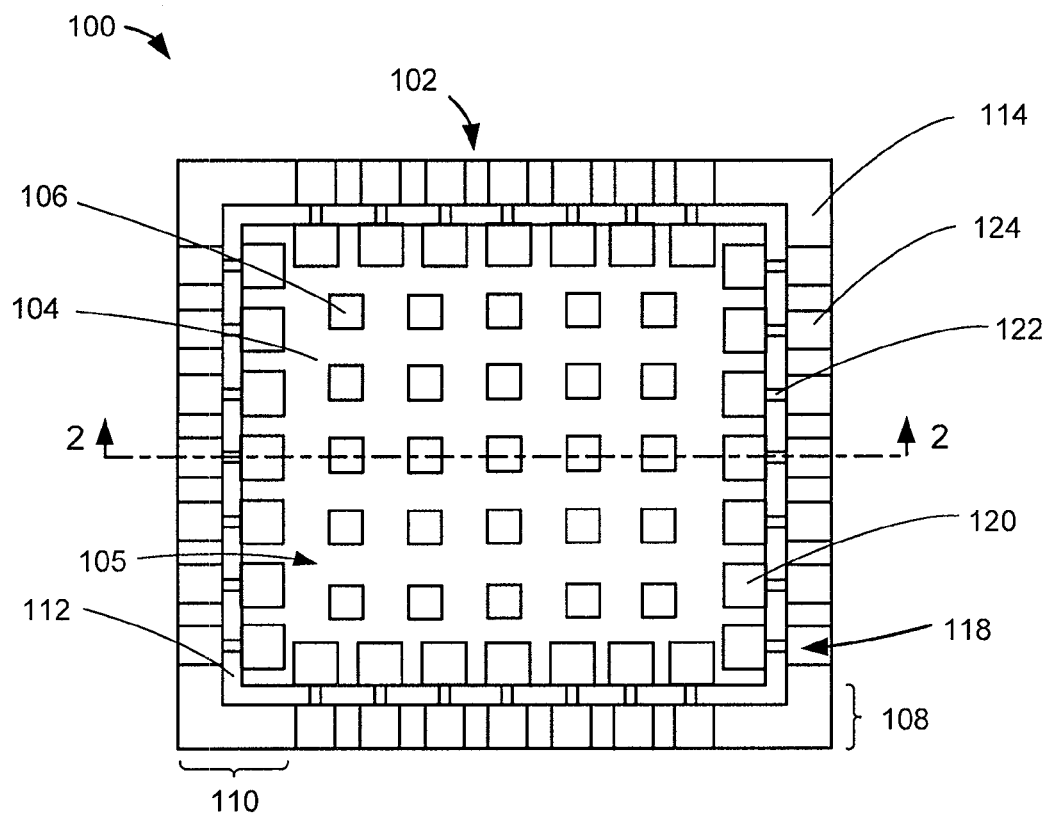
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an integrated circuit 102, such as an integrated circuit die. The integrated circuit 102 can have an active side 104. For example, the active side 104 can include active circuitry (not shown) fabricated thereto. A mounting pad 106, such as a conductive pad that is not a bonding pad of the integrated circuit 102, can be over the active side 104. The mounting pad 106 is optional.

For illustrative purposes, the integrated circuit packaging system 100 is shown with the mounting pad 106 in an array configuration, although it is understood that the integrated circuit packaging system 100 can have a different configuration with the mounting pad 106. For example, the mounting pad 106 can be selectively connected to another of the mounting pad 106. As another example, the mounting pad 106 can differ in size, shape, spacing, or a combination thereof from each another of the mounting pad 106.

The integrated circuit 102 can have an indent 108 from the active side 104 at a peripheral region 110 of the integrated circuit 102. The indent 108 can include a flange 114 and an indent side 112. The indent side 112 can be between the flange 114 and the non-indent portion of the active side 104. The flange 114 can be adjacent to a perimeter of the integrated circuit 102. The integrated circuit 102 includes an elevated portion 105 at an inner or central region of the active side 104. The flange 114 is along the perimeter of elevated portion 105.

A conformal interconnect 118, such as a conductive trace or redistribution layer (RDL), can be over the active side 104, the indent side 112 and the flange 114. The conformal interconnect 118 can have an elevated segment 120 over the active side 104, a sloped segment 122 over the indent side 112, and a flange segment 124 over the flange 114. The elevated segment 120 and the mounting pad 106 are on the elevated portion 105 of the integrated circuit 102. The elevated segment 120 and the mounting pad 106 are physically isolated from one another.

A conformal interconnect 118, such as a conductive trace or redistribution layer (RDL), can be over the active side 104, the indent side 112 and the flange 114. The conformal interconnect 118 can have an elevated segment 120 over the active side 104, a sloped segment 122 over the indent side 112, and a flange segment 124 over the flange 114.

The sloped segment 122 can be between the elevated segment 120 and the flange segment 124. The elevated segment 120 and the flange segment 124 can be wider than the sloped segment 122 providing addition mounting surface area for robust and reliable contact.

Figure 2:
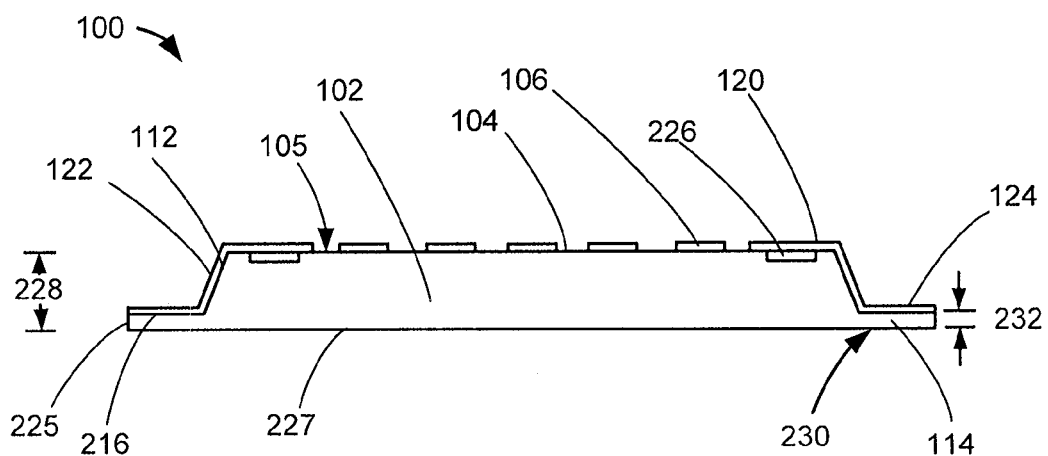
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can have a terminal pad 226, such as a bonding pad, exposed at the active side 104.

The conformal interconnect 118 can be conformal to the indent 108 and the active side 104 adjacent to the indent 108. The elevated segment 120 can be over the terminal pad 226. The elevated segment 120 can be conformal to the active side 104. The elevated segment 120 and the mounting pad 106 are on the elevated portion 105 of the integrated circuit 102.

The sloped segment 122 can be over and conformal to the indent side 112. For illustrative purposes, the indent side 112 is shown at an obtuse angle with the flange 114. Although, it is understood that the indent side 112 can be at a different angle, such as a right or acute angle, with the flange 114, the active side 104, or a combination thereof.

The flange segment 124 can be over and conformal with a flange first side 216 of the flange 114. As an example, the flange segment 124 is below the elevated segment 120. The flange segment 124 of the conformal interconnect 118 can extend to and expose an integrated circuit edge 225 of the integrated circuit 102. The mounting pad 106 can be between the conformal interconnect 118 adjacent to each of the integrated circuit edge 225.

The integrated circuit 102 can have a non-active side 227. An active side height 228 is the distance from the non-active side 227 to the active side 104. The flange 114 can have a flange second side 230. A flange height 232 is the distance from the flange first side 216 to the flange second side 230.

It has been discovered that the present invention provides an integrated circuit packaging system with a thin profile with high capacity and density mounting pads. The indent and the conformal interconnect over the indent provides a low profile connection option. The optional mounting pads also provide high number and high density connection options.

Figure 3:
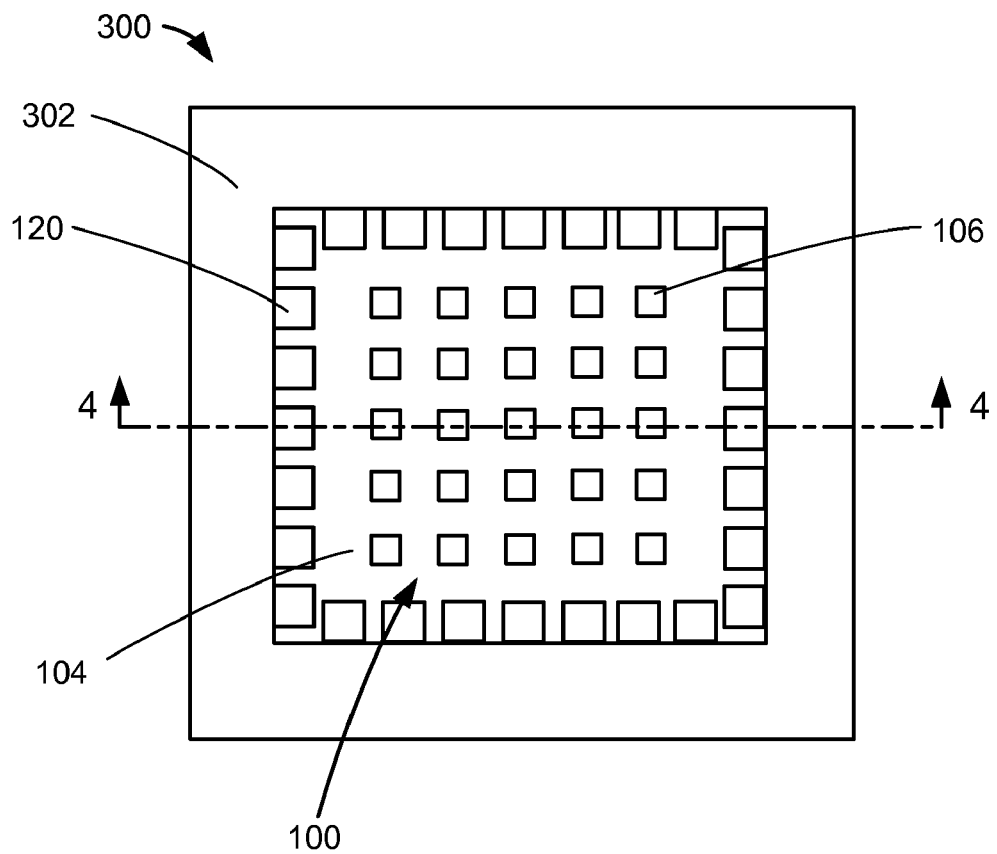
FIG. 3 is a top view of an integrated circuit package-in-package system in a first application example of the integrated circuit packaging system of FIG. 1 in a second embodiment of the present invention.

Referring now to FIG. 3, therein is shown a top view of an integrated circuit package-in-package system 300 in a first application example of the integrated circuit packaging system 100 of FIG. 1 in a second embodiment of the present invention. The top view depicts an encapsulation 302, such as a cover including an epoxy molding compound. The encapsulation 302 can expose the active side 104, the elevated segment 120, and the mounting pad 106.

Figure 4:
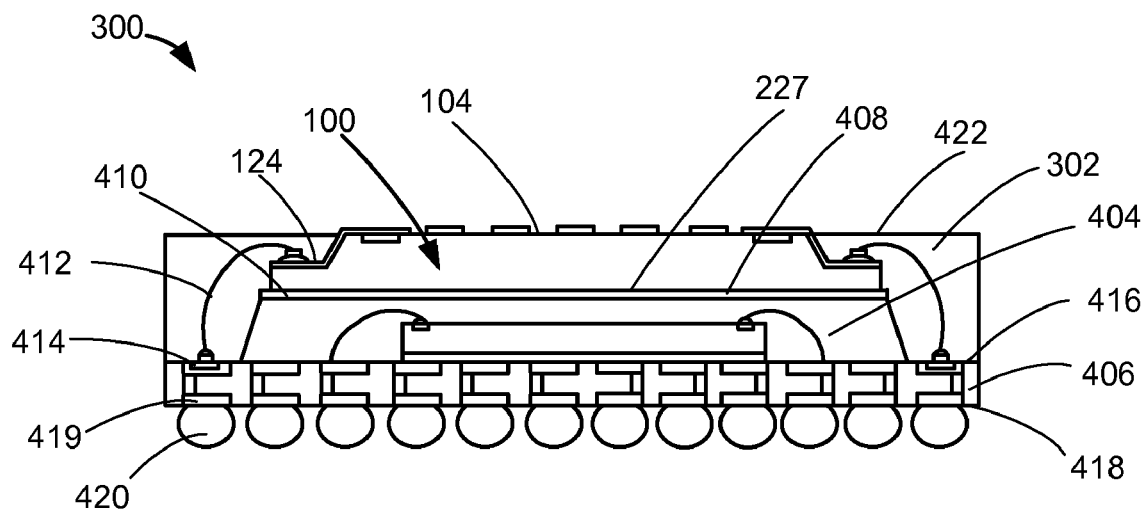
FIG. 4 is a cross-sectional view of the integrated circuit package-in-package system along line 4-4 of FIG. 3.

Referring now to FIG. 4, therein is shown a cross-sectional view of the integrated circuit package-in-package system 300 along line 4-4 of FIG. 3. A device 404, such as a packaged integrated circuit, can be over a carrier 406, such as a laminated substrate. The integrated circuit packaging system 100 can be over the device 404. An adhesive 408, such as a die-attach adhesive, can be between the non-active side 227 of the integrated circuit packaging system 100 and a device first side 410.

An internal interconnect 412, such as a bond wire or a ribbon bond wire, can connect the carrier 406 and the integrated circuit packaging system 100. The carrier 406 can have an interconnect pad 414, such as a contact pad, exposed at a carrier first side 416 of the carrier 406. The internal interconnect 412 can connect the interconnect pad 414 with the flange segment 124.

The carrier 406 can include a carrier second side 418. An external interconnect pad 419, such as a contact pad, can be exposed at the carrier second side 418. An external interconnect 420, such as a solder bump or solder ball, can be attached to the external interconnect pad 419.

The encapsulation 302 can be over the carrier 406 covering the device 404 and the internal interconnect 412. An encapsulation top side 422 of the encapsulation 302 can be planar with the active side 104 of the integrated circuit packaging system 100.

It has also been discovered that the present invention provides an integrated circuit package-in-package system with increased packaging density and lower package profile. The flange segment enables the conformal interconnect to provide multiple levels of connectivity. The flange segment at the indent enables manufactures to connect the integrated packaging system to a base carrier while allowing the elevated segment and the optional mounting pad to be exposed by the encapsulation. The integrated circuit packaging system can be tested prior to assembly, improving product yield.

Figure 5:
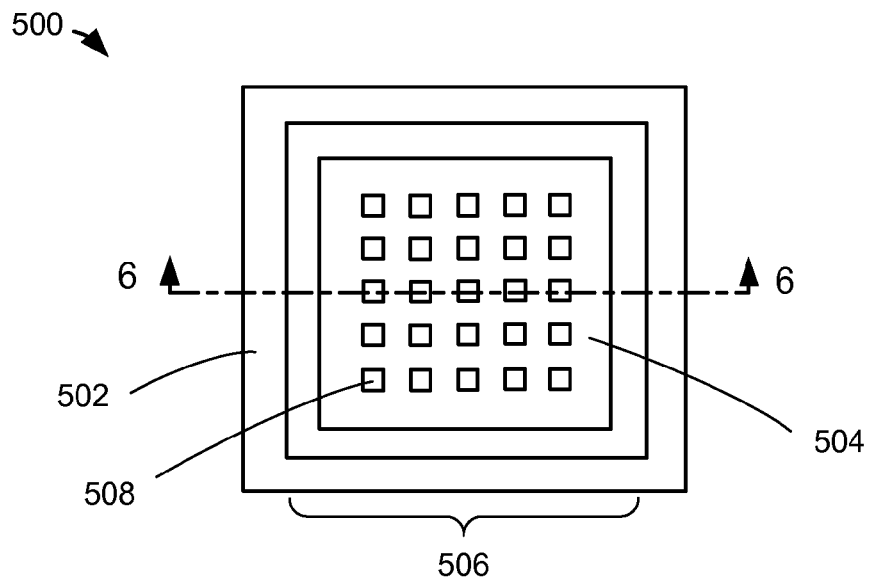
FIG. 5 is a top view of an integrated circuit package-in-package system in a second application example of the integrated circuit packaging system of FIG. 1 in a third embodiment of the present invention.

Referring now to FIG. 5, therein is shown a top view of an integrated circuit package-in-package system 500 in a second application example of the integrated circuit packaging system 100 of FIG. 1 in a third embodiment of the present invention. The top view depicts an encapsulation 502, such as a cover including an epoxy molding compound, with an interposer 504, such as a laminated substrate, exposed in an opening 506 in the encapsulation 502. A contact pad 508 can be exposed from an interposer first side 510 of the interposer 504.

Figure 6:
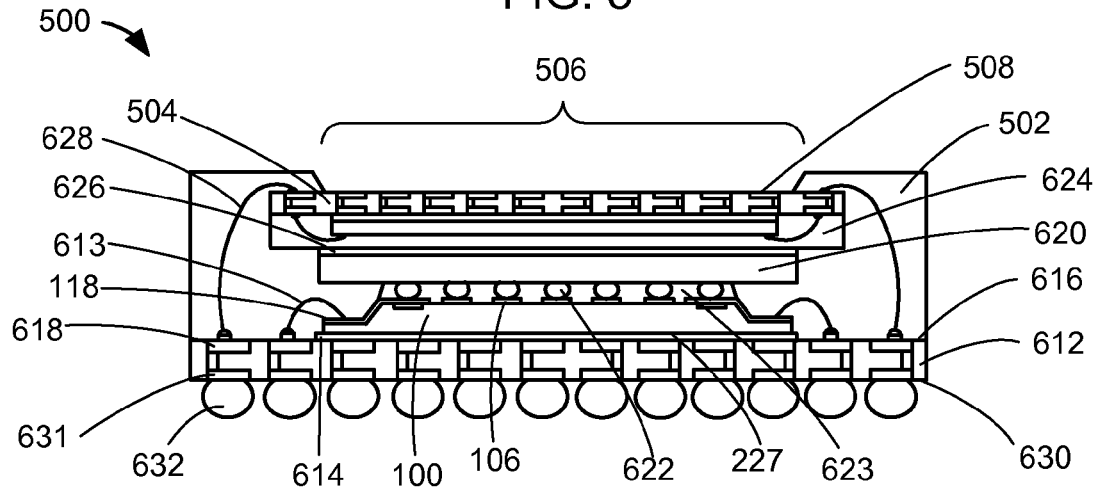
FIG. 6 is a cross-sectional view of the integrated circuit package-in-package system along line 6-6 of FIG. 5.

Referring now to FIG. 6, therein is shown a cross-sectional view of the integrated circuit package-in-package system 500 along line 6-6 of FIG. 5. The integrated circuit packaging system 100 can be over a carrier 612, such as a laminated substrate. A first internal interconnect 613, such as a bond wire or ribbon bond wire, can connect the carrier 612 and the integrated circuit packaging system 100. A first adhesive 614, such as a die-attach adhesive, can be between the non-active side 227 of the integrated circuit packaging system 100 and a carrier first side 616 of the carrier 612. An interconnect pad 618, such as a contact pad, can be exposed from the carrier first side 616.

A first device 620, such as an integrated circuit die or a flip chip, can be over the integrated circuit packaging system 100. An inter-stack interconnect 622, such as a micro solder ball or a solder bump, can connect the first device 620 and the integrated circuit packaging system 100. The inter-stack interconnect 622 can connect to the conformal interconnect 118 and the mounting pad 106.

An underfill 623 can be between the first device 620 and the integrated circuit packaging system 100. The underfill 623 can also surround the inter-stack interconnect 622.

A second device 624, such as a packaged integrated circuit, including the interposer 504 can be over the first device 620. A second adhesive 626, such as an adhesive film, can be between the first device 620 and the second device 624.

A second internal interconnect 628, such as a bond wire or ribbon bond wire, can connect the carrier 612 and the interposer 504. The second internal interconnect 628 can connect the contact pad 508 and the interconnect pad 618.

The carrier 612 can include a carrier second side 630. An external interconnect pad 631, such as a contact pad, can be exposed at the carrier second side 630. An external interconnect 632, such as a solder bump or a solder ball, can be attached to the external interconnect pad 631.

The encapsulation 502 can be over the carrier 612 covering the integrated circuit packaging system 100, the first internal interconnect 613, the first device 620, and the second internal interconnect 628. The encapsulation 502 covers the second device 624 and exposes the interposer 504 at the opening 506.

Figure 7:
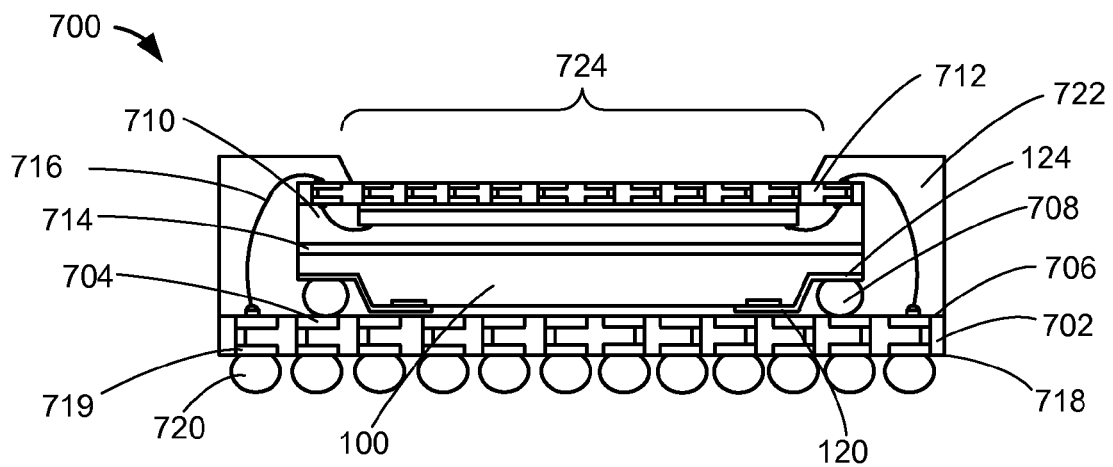
FIG. 7 is a cross-sectional view of an integrated circuit package-in-package system in a third application example of the integrated circuit packaging system of FIG. 1 exemplified by the top view along line 6-6 of FIG. 5 in a fourth embodiment of the present invention.

Referring now to FIG. 7, therein is shown a cross-sectional view of a integrated circuit package-in-package system 700 in a third application example of the integrated circuit packaging system 100 of FIG. 1 exemplified by the top view along line 6-6 of FIG. 5 in a fourth embodiment of the present invention. The integrated circuit packaging system 100 can be over a carrier 702, such as a laminated substrate.

An interconnect pad 704, such as a contact pad, can be exposed from a carrier first side 706 of the carrier 702. A first internal interconnect 708, such as a solder ball or a solder bump, can connect the flange segment 124 and the interconnect pad 704. The elevated segment 120 can contact the carrier 702.

A device 710, such as a packaged integrated circuit, having an interposer 712, such as a laminated substrate, can be over the integrated circuit packaging system 100. An adhesive 714, such as a die-attach adhesive, can be between the integrated circuit packaging system 100 and the device 710. A second internal interconnect 716, such as a bond wire or a ribbon bond wire, can connect the carrier 702 and the interposer 712.

The carrier 702 can have a carrier second side 718. An external interconnect pad 719, such as a bond pad, can be exposed at the carrier second side 718. An external interconnect 720, such as a solder bump or a solder ball, can be connected to the external interconnect pad 719.

An encapsulation 722, such as a cover including epoxy molding compound, can be over the carrier 702 covering the integrated circuit packaging system 100, the device 710, the first internal interconnect 708, the second internal interconnect 716, and the interposer 712. An opening 724 of the encapsulation 722 can expose the interposer 712.

Figure 8:
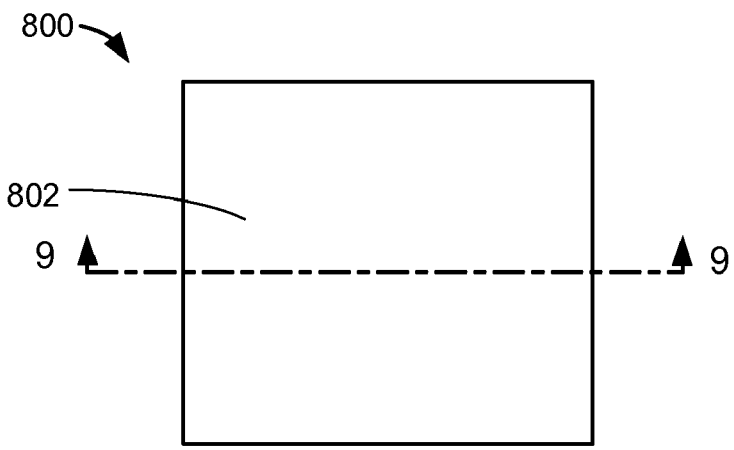
FIG. 8 is a top view of a integrated circuit package-in-package system in a fourth application example of the integrated circuit packaging system of FIG. 1 in a fifth embodiment of the present invention.

Referring now to FIG. 8, therein is shown a top view of an integrated circuit package-in-package system 800 in a fourth application example of the integrated circuit packaging system 100 of FIG. 1 in a fifth embodiment of the present invention. The top view depicts an encapsulation 802, such as a cover including an epoxy molding compound.

For illustrative purposes, the integrated circuit package-in-package system 800 is shown with the encapsulation 802 having a square geometric configuration, although it is understood that the encapsulation can have a different geometric configuration. For example, the integrated circuit package-in-package system 800 can have a rectangular configuration.

Figure 9:
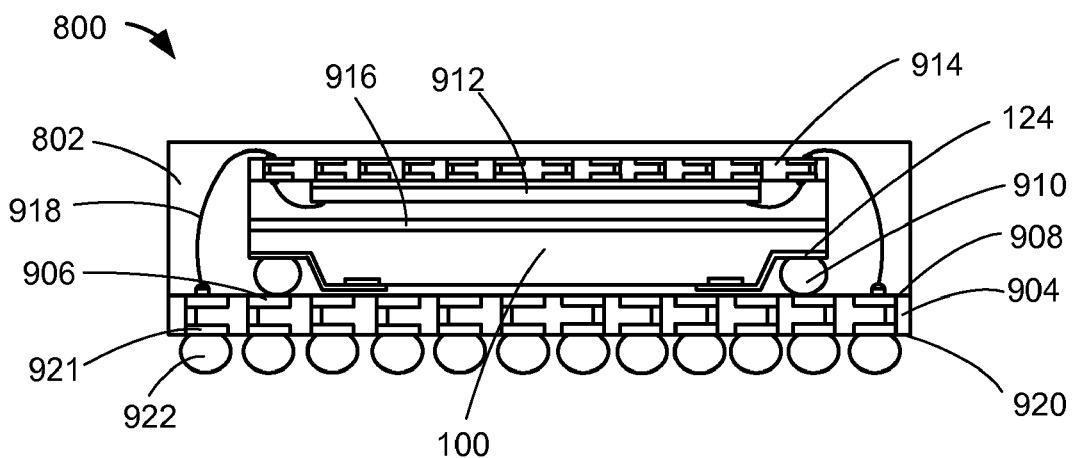
FIG. 9 is a cross-sectional view of the integrated circuit package-in-package system along line 9-9 of FIG. 8.

Referring now to FIG. 9, therein is shown a cross-sectional view of the integrated circuit package-in-package system 800 along line 9-9 of FIG. 8. The integrated circuit packaging system 100 can be over a carrier 904, such as a laminated substrate. An interconnect pad 906, such as a contact pad, can be exposed from a carrier first side 908 of the carrier 904. A first internal interconnect 910, such as a solder ball or solder bump, can connect the flange segment 124 and the interconnect pad 906.

A device 912, such as a packaged integrated circuit, having an interposer 914, such as a laminated substrate, can be over the integrated circuit packaging system 100. An adhesive 916, such as a die-attach adhesive, can be between the integrated circuit packaging system 100 and the device 912. A second internal interconnect 918, such as a bond wire or a ribbon bond wire, can connect the carrier 904 and the interposer 914.

The carrier 904 can have a carrier second side 920. An external interconnect pad 921, such as a contact pad, can be exposed at the carrier second side 920. An external interconnect 922, such as a solder bump or a solder ball, can be connected to the external interconnect pad 921. The encapsulation 802 can be over the carrier 904, the integrated circuit packaging system 100, the device 912, the first internal interconnect 910, the second internal interconnect 918, and the interposer 914.

Figure 10:
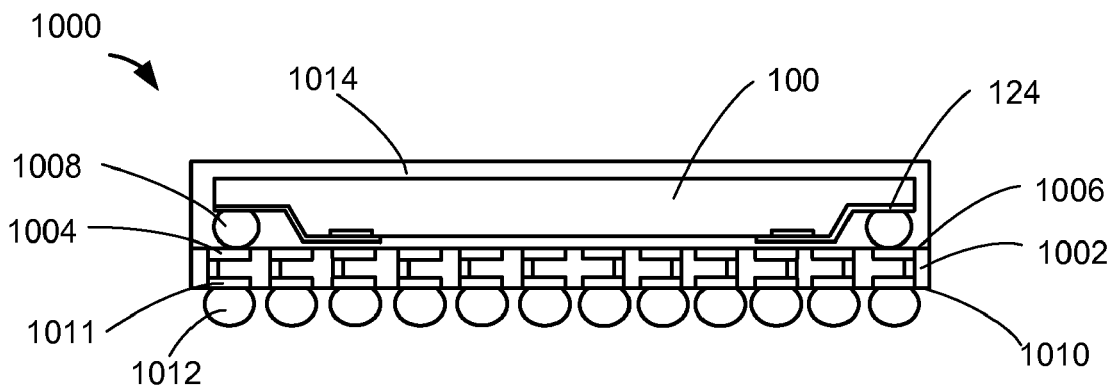
FIG. 10 is a cross-sectional view of a integrated circuit package-in-package system in a fifth application example of the integrated circuit packaging system of FIG. 1 exemplified by the top view line 9-9 of FIG. 8 in a sixth embodiment of the present invention.

Referring now to FIG. 10, therein is show a cross-sectional view of an integrated circuit packaging system 1000 in a fifth application example of the integrated circuit packaging system 100 of FIG. 1 exemplified by the top view along line 9-9 of FIG. 8 in a sixth embodiment of the present invention. The integrated circuit packaging system 100 can be over a carrier 1002, such as a laminated substrate.

An interconnect pad 1004, such as a contact pad, can be exposed from a carrier first side 1006 of the carrier 1002. An internal interconnect 1008, such as a solder ball or a solder bump, can connect the flange segment 124 and the interconnect pad 1004.

The carrier 1002 can have a carrier second side 1010. An external interconnect pad 1011, such as a contact pad, can be exposed on the carrier second side 1010. An external interconnect 1012, such as a solder bump or a solder ball, can be connected to the external interconnect pad 1011. An encapsulation 1014 can be over the carrier 1002, the integrated circuit packaging system 100, and the internal interconnect 1008.

Figure 11:
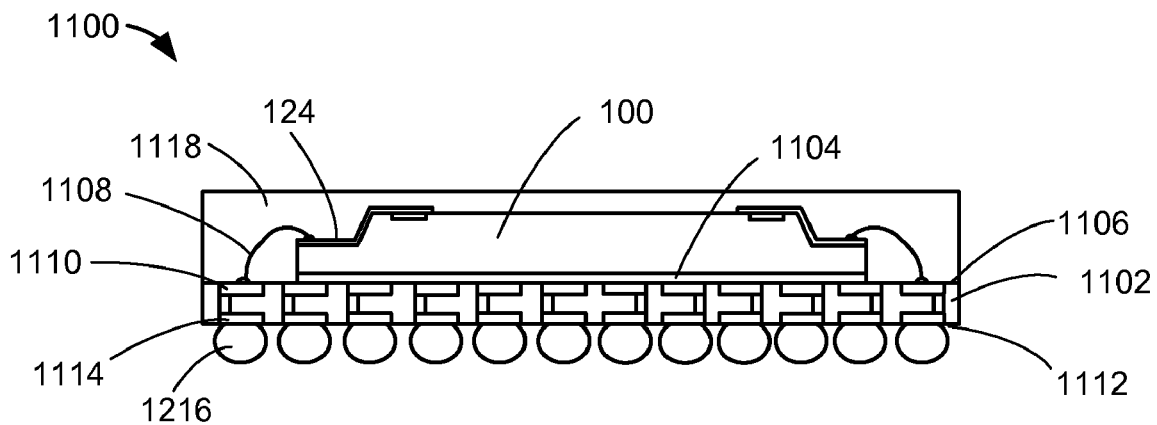
FIG. 11 is a cross-sectional view of a integrated circuit package-in-package system in a sixth application example of the integrated circuit packaging system of FIG. 1 exemplified by the top view line 9-9 of FIG. 8 in a seventh embodiment of the present invention.

Referring now to FIG. 11, therein is shown a cross-sectional view of a integrated circuit package-in-package system 1100 in a sixth application example of the integrated circuit packaging system 100 of FIG. 1 exemplified by the top view along line 9-9 of FIG. 8 in a seventh embodiment of the present invention. The integrated circuit packaging system 100 can be over a carrier 1102, such as a laminated substrate. An adhesive 1104, such as a die-attach adhesive, can be between the integrated circuit packaging system 100 and a carrier first side 1106 of the carrier 1102.

An internal interconnect 1108, such as a bond wire or a ribbon bond wire, can connect the integrated circuit packaging system 100 and the carrier 1102. An interconnect pad 1110, such as a contact pad, can be exposed on the carrier first side 1106. The internal interconnect 1108 can connect the flange segment 124 and the interconnect pad 1110.

The carrier 1102 can have a carrier second side 1112. An external interconnect pad 1114, such as a contact pad, can be exposed on the carrier second side 1112. An external interconnect 1216, such as a solder bump or a solder ball, can be connected to the external interconnect pad 1114. An encapsulation 1118, such as a cover including epoxy molding compound, can be over the carrier 1102, the integrated circuit packaging system 100, and the internal interconnect 1108.

Figure 12:
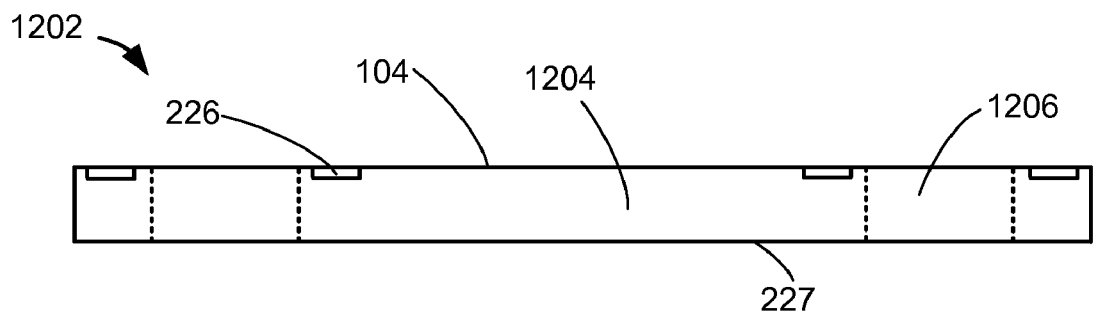
FIG. 12 is a cross-sectional view of a portion of a wafer.

Referring now to FIG. 12, therein is shown a cross-sectional view of a portion of a wafer 1202. The wafer 1202 can have a device region 1204, such as an un-cut silicon die, and a singulation region 1206, such as a saw street. The device region 1204 and the singulation region 1206 as separated by dotted lines in the figure.

The wafer 1202 can be processed to have the active side 104 and the non-active side 227. For example, the active side 104 can include active circuitry (not shown) fabricated thereto. The terminal pad 226 can be exposed from the active side 104.

Figure 13:
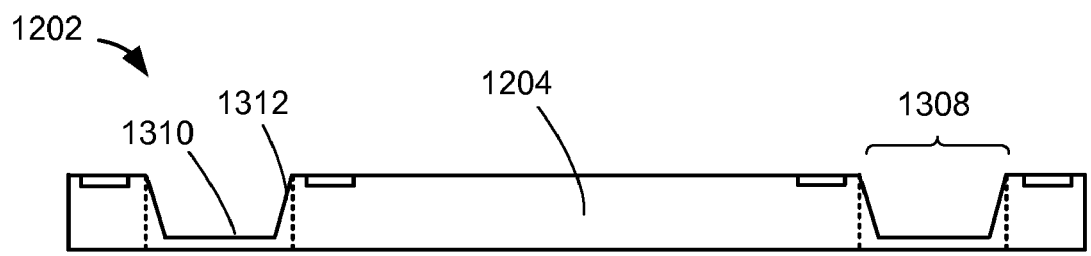
FIG. 13 is the structure of FIG. 12 in forming a recess in the wafer.

Referring now to FIG. 13, therein is shown the structure of FIG. 12 in forming a recess 1308 in the wafer 1202. The recess 1308 can be formed in a number of different ways. For example, the recess 1308 can be formed by methods such as chemical etching, mechanical grinding, or laser cutting. Forming the recess 1308 does not disturb the device region 1204.

The recess 1308 can include a recess bottom 1310 and a recess side 1312. For illustrative purposes, the recess side 1312 is shown at an obtuse angle with the recess bottom 1310, although it is understood that the recess side 1312 can form different angles with the recess bottom 1310. For example, the recess side 1312 can form a right angle or an acute angle with the recess bottom 1310.

Figure 14:
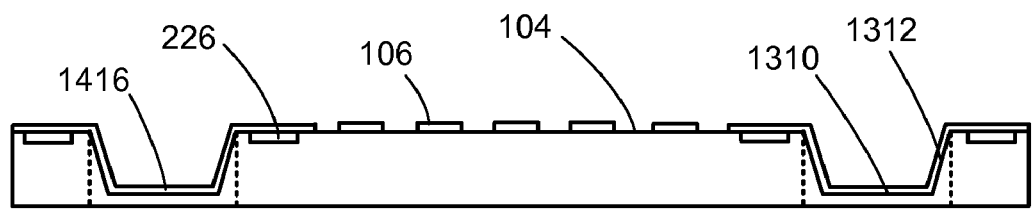
FIG. 14 is the structure of FIG. 13 in forming a conductive structure.

Referring now to FIG. 14, therein is shown the structure of FIG. 13 in forming a conductive structure 1416. The conductive structure 1416 can be formed over the terminal pad 226, the recess side 1312, and the recess bottom 1310.

The conductive structure 1416 can be formed in a number of ways. For example, the conductive structure 1416 can be formed by masking and metal deposition techniques, such as sputtering or electroplating. Optionally, forming the conductive structure 1416 can also include forming the mounting pad 106 over the active side 104.

Figure 15:
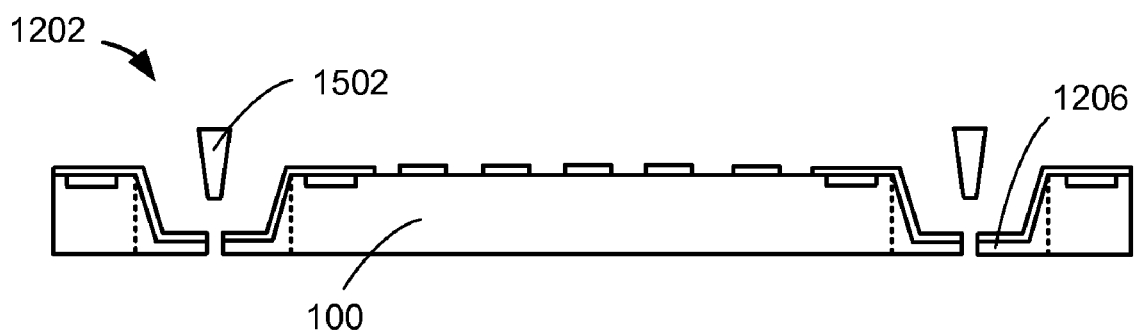
FIG. 15 is the structure of FIG. 14 in forming the integrated circuit packaging system.

Referring now to FIG. 15, therein is shown the structure of FIG. 14 in forming the integrated circuit packaging system 100. The integrated circuit packaging system 100 can be formed by singulating the wafer 1202 of FIG. 13 along the singulation region 1206. Singulation can be performed by a singulation tool 1502. For example, the singulation tool 1502 can be a saw or laser.

Singulation of the wafer 1202 forms the indent 108 from the recess 1308 of FIG. 13 in the integrated circuit packaging system 100. The recess bottom 1310 of FIG. 14 and the recess side 1312 of FIG. 14 can form the indent 108. Furthermore, singulation of the wafer 1202 also forms the conformal interconnect 118.

Figure 16:
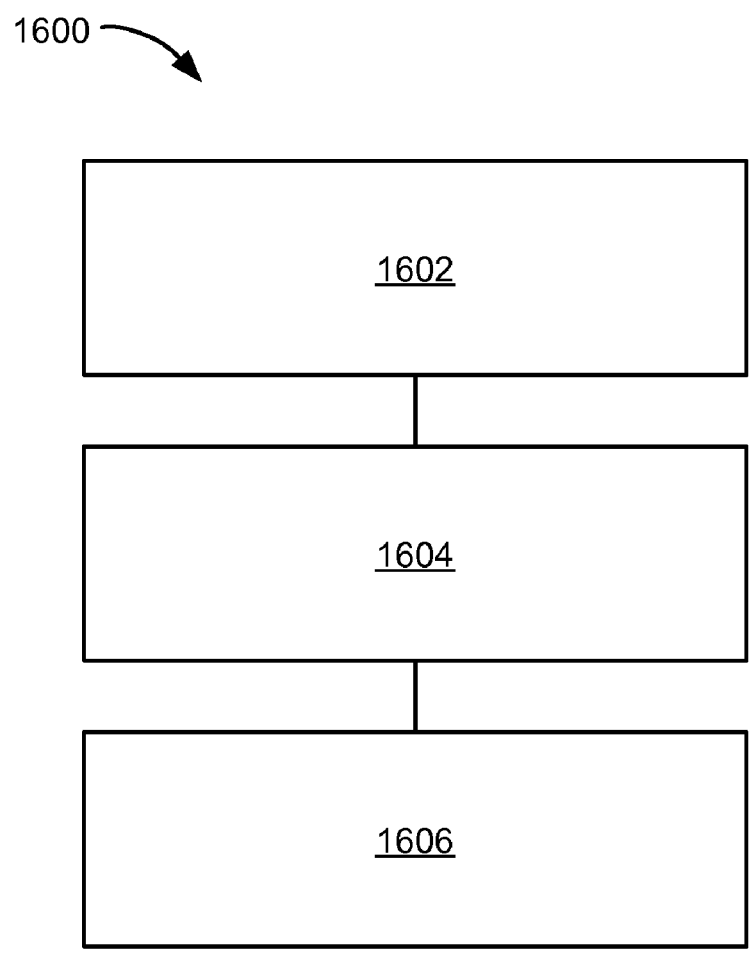
FIG. 16 is a flow chart of a method of manufacture of an integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes providing an integrated circuit having an active side and a non-active side in block 1602; forming an indent, having a flange and an indent side, from a peripheral region of an active side in block 1604; and forming a conformal interconnect, having an elevated segment, a slope segment and a flange segment, over an indent in block 1606.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   an integrated circuit, having an active side and a non-active side, with an indent, having a flange and an indent side, in a peripheral region of the active side and an elevated portion at a central region of the active side, the flange along the perimeter of the elevated portion, the integrated circuit includes a terminal pad at the active side; and
   a conformal interconnect, having an elevated segment, a sloped segment, and a flange segment, over the indent, the conformal interconnect includes the sloped segment between the flange segment and the elevated segment;
   a mounting pad on the active side, the mounting pad and the elevated segment on the elevated portion;
   a carrier with the integrated circuit thereover and connected to the flange segment;
   a device mounted over the carrier; and
   an encapsulation over the integrated circuit and the device with the elevated segment exposed.

2. The system as claimed in claim 1 wherein:
   the conformal interconnect having the elevated segment includes the elevated segment over the terminal pad.

3. The system as claimed in claim 1 wherein the integrated circuit includes an integrated circuit edge exposed by the conformal interconnect.

4. The system as claimed in claim 1 wherein:
   the device is mounted over the integrated circuit and connected to the carrier; and
   the encapsulation includes an opening over the integrated circuit and the device with the device exposed by the opening.

* * * * *